United States Patent
Zhang et al.

(10) Patent No.: US 11,567,828 B2
(45) Date of Patent: Jan. 31, 2023

(54) ASYMMETRIC LLR GENERATION USING ASSIST-READ

(71) Applicant: SK hynix Inc., Incheon-si (KR)

(72) Inventors: Fan Zhang, Fremont, CA (US); Aman Bhatia, Los Gatos, CA (US)

(73) Assignee: SK hynix Inc., Icheon-si (KR)

(*) Notice: Subject to any disclaimer, the term of this patent is extended or adjusted under 35 U.S.C. 154(b) by 266 days.

(21) Appl. No.: 16/925,160

(22) Filed: Jul. 9, 2020

(65) Prior Publication Data

US 2022/0012124 A1  Jan. 13, 2022

(51) Int. Cl.

| | |
|---|---|
| G06F 11/00 | (2006.01) |
| G06F 11/10 | (2006.01) |
| G06F 11/07 | (2006.01) |
| G06F 11/30 | (2006.01) |
| G11C 16/34 | (2006.01) |
| G06F 12/0811 | (2016.01) |

(Continued)

(52) U.S. Cl.
CPC ........ *G06F 11/1068* (2013.01); *G06F 11/076* (2013.01); *G06F 11/3037* (2013.01); *G06F 12/0811* (2013.01); *G06F 12/0882* (2013.01); *G11C 16/3477* (2013.01); *H03M 13/3927* (2013.01)

(58) Field of Classification Search
CPC ............... G06F 11/1068; G06F 11/076; G06F 11/3037; G06F 12/0811; G06F 12/0882; G11C 16/3477; H03M 13/3927
See application file for complete search history.

(56) References Cited

U.S. PATENT DOCUMENTS

| | | |
|---|---|---|
| 9,367,389 B2 * | 6/2016 | Alhussien ........... H03M 13/458 |
| 9,396,792 B2 | 7/2016 | Wu et al. |
| 10,191,804 B2 | 1/2019 | Tehrani et al. |

(Continued)

OTHER PUBLICATIONS

Kim, et al., "Low-Energy Error Correction of NAND Flash Memory Through Soft-Decision Decoding", EURASIP Journal on Advances in Signal Processing, vol. 2012, No. 1, Article 195, Available Online at: https://link.springer.com/article/10.1186/1687-6180-2012-195, Sep. 2012, pp. 1-12.

(Continued)

*Primary Examiner* — Christine T. Tu
(74) *Attorney, Agent, or Firm* — Weaver Austin Villeneuve & Sampson LLP

(57) ABSTRACT

A method of operating a storage system is provided. The storage system includes memory cells and a memory controller, wherein each memory cell is an m-bit multi-level cell (MLC), where m is an integer, and the memory cells are arranged in m pages. The method includes determining initial LLR (log likelihood ratio) values for each of the m pages, comparing bit error rates in the m pages, identifying a programmed state in one of the m pages that has a high bit error rate (BER), and selecting an assist-read threshold voltage of the identified page. The method also includes performing an assist-read operation on the identified page using the assist-read threshold voltage, determining revised LLR values for the identified page based on results from the assist-read operation, and performing soft decoding using the revised LLR values for the identified page and the initial LLR values for other pages.

20 Claims, 10 Drawing Sheets

(51) Int. Cl.
   *H03M 13/39*     (2006.01)
   *G06F 12/0882*   (2016.01)

(56) References Cited

U.S. PATENT DOCUMENTS

| | | | |
|---|---|---|---|
| 10,198,313 | B2 | 2/2019 | Barndt et al. |
| 10,284,233 | B2 | 5/2019 | Bazarsky et al. |
| 10,565,053 | B1 | 2/2020 | Hsiao |
| 11,258,466 | B1 * | 2/2022 | Kanter ............... G06F 11/1012 |
| 2015/0365106 | A1 * | 12/2015 | Wu ................... H03M 13/6325 |
| | | | 714/773 |
| 2019/0303236 | A1 | 10/2019 | Ellis et al. |
| 2019/0340062 | A1 | 11/2019 | Cai et al. |
| 2020/0012561 | A1 * | 1/2020 | Lu ..................... H03M 13/3723 |
| 2020/0104209 | A1 | 4/2020 | El Gamal et al. |

OTHER PUBLICATIONS

Xiao-Bo, et al., "Novel Reliability Evaluation Method for NAND Flash Memory", Institute of Electrical and Electronics Engineers Region 10 Conference, Tencon 2015, Available Online at: https://ieeexplore.ieee.org/document/7372718, Jan. 7, 2016, 4 pages.

Zhang, et al., "RBER Aware Multi-Sensing for Improving Read Performance of 3D MLC NAND Flash Memory", Institute of Electrical and Electronics Engineers Access, vol. 6, Available Online at: http://dx.doi.org/10.1109/ACCESS.2018.2873081, Oct. 1, 2018, pp. 61934-61947.

* cited by examiner

ASYMMETRIC LLR GENERATION USING ASSIST-READ

BACKGROUND OF THE INVENTION

The present invention relates generally to systems and methods for storage devices, and specifically to improving performance of non-volatile memory devices, such as solid state disks (SSDs).

Solid-state memory is ubiquitously used in a variety of electronic systems including, for example, consumer electronic devices (e.g., cellular phones, cameras, computers, etc.) and in enterprise computing systems (e.g., hard drives, random access memory (RAM), etc.). Solid-state memory has gained popularity over mechanical or other memory storage techniques due to latency, throughput, shock resistance, packaging, and other considerations.

To increase storage density, multi-bit multi-level memory cells are finding increasing usage. As the density increases, the margin for error decreases. Therefore, error correction codes have become indispensable in solid-state memories. Accordingly, effective and efficient techniques for performing error correction are highly desirable.

BRIEF SUMMARY OF THE INVENTION

Some embodiments of the present invention are directed to improving the log likelihood ratio (LLR) for soft decoding in a multi-level memory device. In embodiments of the present invention, an additional assist-read is carried out when reading a page, when some of the distribution of cells in a PV-level has higher variance than other PV-levels, or when some read-threshold is not placed optimally. Different magnitude of LLRs can be assigned based on the assist-read. The proposed scheme can help to improve the performance of soft decoders, for example, the low-density parity-check code (LDPC) min-sum decoder in cases of high retention, high program-erase cycle or larger read-disturb effects, and improve quality of service (QoS) at end of life (EOL). The proposed scheme can also be used in any soft decoders.

According to some embodiments of the present invention, a method of operating a storage system is provided. The storage system includes memory cells and a memory controller coupled to the memory cells for controlling operations of the memory cells. Each memory cell is a 3-bit tri-level cell (TLC), wherein the memory cells are arranged in LSB (least significant bit) pages, CSB (center significant bit) pages, and MSB (most significant bit) pages. Each of the memory cells comprises eight programmed voltage (PV) levels (PV0-PV7), wherein PV0 is an erased state. The method includes performing a read operation on the memory cells in response to a read command from a host. Here, performing the read operation includes reading the memory cells using seven read threshold values (Vr1-Vr7) to determine the programmed voltages (PVs) of the memory cells, including using threshold values Vr1 and Vr5 for MSB, using threshold values Vr2, Vr4, and Vr6 for CSB, and using threshold values Vr3 and Vr7 for LSB. The method includes determining initial LLR (log likelihood ratio) values for the memory cells based on the result from the read operation. An assist-read operation on the memory cells in the MSB page is performed, by reading the memory cells using a read threshold voltage Vr2 or Vr3, either of which is positioned between programmed voltage levels PV3 and PV4. Revised LLR values are determined for the MSB page based on results from the assist-read operation. The method further includes performing soft decoding using the revised LLR values for the MSB page and the initial LLR values for the CSB page and LSB page.

In some embodiments of the above method, determining initial LLR (log likelihood ratio) values includes using a memory-cell threshold-voltage distribution model to determine the initial LLR values.

In some embodiments, determining initial LLR values comprises using fine-grained memory-cell sensing for calculation of LLR values.

In some embodiments, determining revised LLR (log likelihood ratio) values comprises using a memory-cell threshold-voltage distribution model to determine the revised LLR values.

In some embodiments of the present invention, a method of operating a storage system is provided. The storage system includes memory cells and a memory controller coupled to the memory cells for controlling operations of the memory cells, wherein each memory cell is an m-bit multi-level cell (MLC), where m is an integer. The memory cells are arranged in m pages, and each of the m bits of a given memory cell provides data for a corresponding one of the m pages. The method includes determining initial LLR (log likelihood ratio) values for each of the m pages, comparing bit error rates in the m pages, identifying a programmed state in one of the m pages that has a high bit error rate (BER), and selecting an assist-read threshold voltage for the identified page. The method also includes performing an assist-read operation on the identified page using the assist-read threshold voltage, determining revised LLR values for the identified page based on results from the assist-read operation, and performing soft decoding using the revised LLR values for the identified page and the initial LLR values for other pages.

In some embodiments of the above method, the programmed state that has a high bit error rate includes an erased state having an adjacent opposite programmed state, wherein the assist-read threshold voltage is selected to distinguish the adjacent opposite programmed state from the erased state.

In some embodiments of the above method, the programmed state that has a high bit error rate includes a highest programmed state having an adjacent opposite programmed state, wherein the assist-read threshold voltage is selected to distinguish the adjacent opposite programmed state from the highest programmed state.

In some embodiments of the above method, determining initial LLR (log likelihood ratio) values comprises using a memory-cell threshold-voltage distribution model to determine the initial LLR values.

In some embodiments of the above method, determining initial LLR values comprises using fine-grained memory-cell sensing for calculation of LLR values.

In some embodiments of the above method, each memory cell is a 3-bit tri-level cell (TLC), and the memory cells are arranged in LSB (least significant bit) pages, CSB (center significant bit) pages, and MSB (most significant bit) pages, using seven read threshold voltages (Vr1-Vr7), wherein the assist-read is performed on the MSB page using an assist-read threshold voltage Vr2 or Vr3.

In some embodiments of the above method, each memory cell is a 3-bit tri-level cell (TLC), and the memory cells are arranged in LSB (least significant bit) pages, CSB (center significant bit) pages, and MSB (most significant bit) pages, using seven read threshold voltages (Vr1-Vr7), wherein the assist-read is performed on the LSB pages using an assist-read threshold voltage Vr5 or Vr6.

In some embodiments of the above method, each memory cell is a 4-bit quad-level cell (QLC), and the memory cells are arranged in LSB (least significant bit) pages, LCSB (least central significant bit) pages, MCSB (most central significant bit) pages, and MSB (most significant bit) pages, using fifteen read threshold voltages (Vr1-Vr15), wherein the assist-read is performed on the LSB pages using an assist-read threshold voltage Vr2 or Vr3.

In some embodiments of the above method, each memory cell is a 4-bit quad-level cell (QLC), and the memory cells are arranged in LSB (least significant bit) pages, LCSB (least central significant bit) pages, MCSB (most central significant bit) pages, and MSB (most significant bit) pages, using fifteen read threshold voltages (Vr1-Vr15), wherein the assist-read is performed on the MCSB pages using an assist-read threshold voltage Vr13 or Vr14.

According to some embodiments of the present invention, a storage system includes memory cells and a memory controller coupled to the memory cells for controlling operations of the memory cells. Each memory cell is an m-bit multi-level cell (MLC), where m is an integer. The memory cells are arranged in m pages, each of the m bits of a given memory cell providing data for a corresponding one of the m pages. The memory controller is configured to determine initial LLR (log likelihood ratio) values for each of the m pages, compare bit error rates in the m pages, and identify a programmed state in one of the m pages that has a high bit error rate. The memory controller is also configured to select an assist-read threshold voltage for the identified page, and perform an assist-read operation on the identified page using the assist-read threshold voltage. Further, the memory controller is configured to determine revised LLR values for the identified page based on results from the assist-read operation and perform soft decoding using the revised LLR values for the identified page and the initial LLR values for other pages.

In some embodiments of the above storage system, the programmed state that has a high bit error rate includes an erased state having an adjacent opposite programmed state. In this case, the assist-read threshold voltage is selected to distinguish the adjacent opposite programmed state from the erased state.

In some embodiments of the above storage system, the programmed state that has a high bit error rate includes a highest programmed state having an adjacent opposite programmed state. In this case, the assist-read threshold voltage is selected to distinguish the adjacent opposite programmed state from the highest programmed state.

In some embodiments of the above storage system, the memory controller is configured to determine initial LLR (log likelihood ratio) values using a memory-cell threshold-voltage distribution model to determine the initial LLR values.

In some embodiments of the above storage system, the memory controller is configured to determine initial LLR values using fine-grained memory-cell sensing for calculation of LLR values.

In some embodiments of the above storage system, each memory cell is a 3-bit tri-level cell (TLC), and the memory cells are arranged in LSB (least significant bit) pages, CSB (center significant bit) pages, and MSB (most significant bit) pages, using seven read threshold voltages (Vr1-Vr7), wherein the memory controller is configured to perform the assist-read on the MSB page using an assist-read threshold voltage Vr2 or Vr3.

In some embodiments of the above storage system, each memory cell is a 3-bit tri-level cell (TLC), and the memory cells are arranged in LSB (least significant bit) pages, CSB (center significant bit) pages, and MSB (most significant bit) pages, using seven read threshold voltages (Vr1-Vr7), wherein the memory controller is configured to perform the assist-read on the LSB page using an assist-read threshold voltage Vr5 or Vr6.

Various additional embodiments, features, and advantages of the present invention are provided with reference to the detailed description and accompanying drawings that follow.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Error-correcting codes are frequently used in communications, as well as for reliable storage in media such as CDs, DVDs, hard disks, and random access memories (RAMs), flash memories and the like. Error correcting codes may include Low density parity check (LDPC) codes, turbo product codes (TPC), Bose-Chaudhuri-Hocquenghem (BCH) codes, Reed Solomon codes, and the like.

Figure 1:
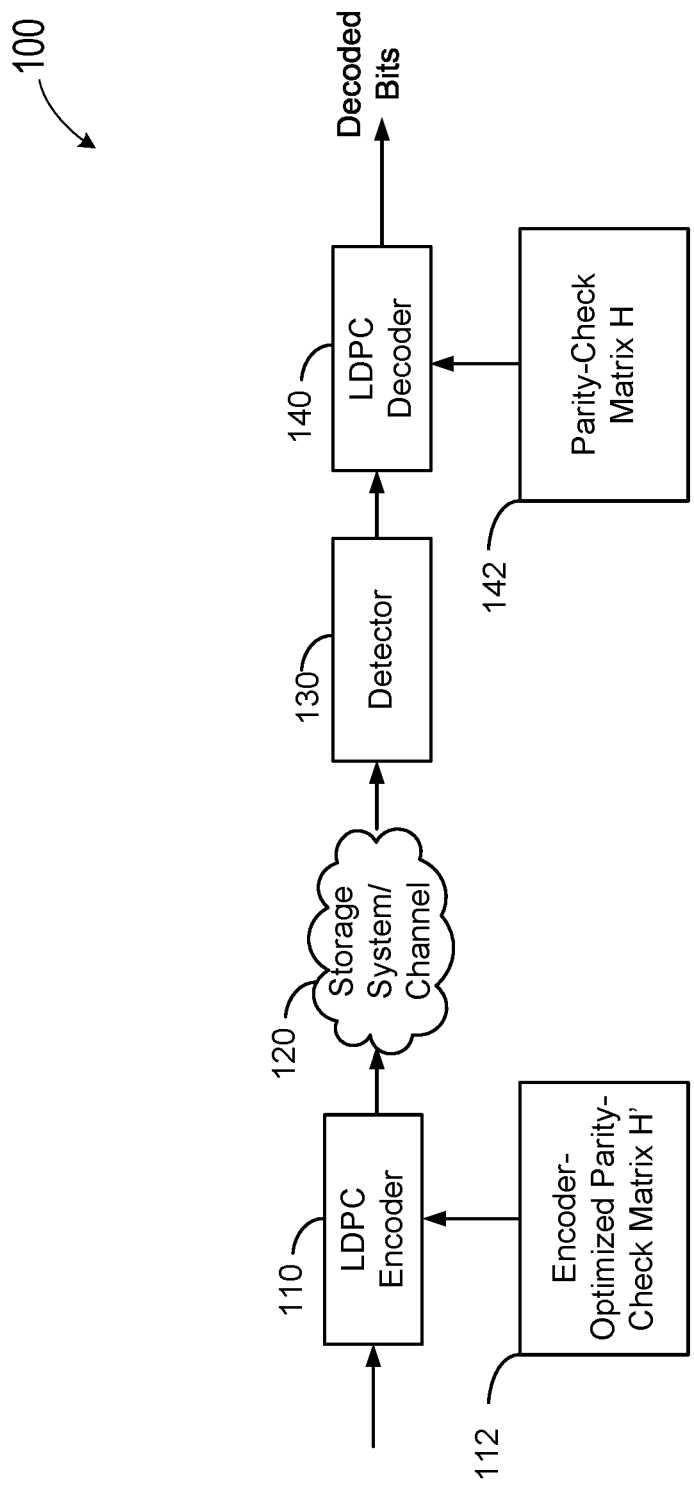
FIG. 1 illustrates an example high level block diagram of an error correcting system, in accordance with certain embodiments of the present disclosure.

FIG. 1 is a high level block diagram illustrating an example LDPC error correcting system in accordance with certain embodiments of the present disclosure. As illustrated in FIG. 1, an LDPC encoder 110 of error correction system 100 may receive information bits that include data which is desired to be stored in a storage system 120. LDPC encoded data may be generated by LDPC encoder 110 and may be written to storage system 120. The encoding may use an encoder-optimized parity-check matrix H (112).

In various embodiments, storage system 120 may include a variety of storage types or media. Errors may occur in data storage or communication channel. For example, the errors may be caused by, for example, cell-to-cell interference and/or coupling. When the stored data is requested or otherwise desired (e.g., by an application or user which stored the data), a detector 130 may receive data from storage system 120. The received data may include some noise or errors. Detector 130 may include a soft output detector and a hard output detector and may perform detection on the received data and output decision and/or reliability information.

For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information may be passed to an LDPC decoder 140 which may perform LDPC decoding using the decision and/or reliability information. A soft LDPC decoder may utilize both the decision and the reliability information to decode the codeword. A hard LDPC decoder may utilize only the decision values from the detector to decode the codeword. The decoded bits generated by LDPC decoder 140 may be passed to an appropriate entity (e.g., the user or application which requested it). The decoding may utilize a parity-check matrix H 142, which may be optimized for LDPC decoder 140 by design. With proper encoding and decoding, the decoded bits would match the information bits. In some implementations, parity-check matrix H 142 may be the same as encoder-optimized parity-check matrix H 112. In some implementations, encoder-optimized parity-check matrix H 112 may be modified from parity-check matrix H 142. In some implementations, parity-check matrix H 142 may be modified from encoder-optimized parity-check matrix H 12.

LDPC codes are usually represented by bipartite graphs including two sets of nodes. One set of nodes, the variable or bit nodes correspond to elements of the codeword and the other set of nodes, the check nodes, correspond to the set of parity-check constraints satisfied by the codeword. The connections between the variable nodes and the check nodes are defined by the parity check matrix H (e.g., parity check matrix 142 of FIG. 1). A check node can receive messages from one or more variable nodes and return an updated message. The messages between the variable nodes and the check nodes can be in the form of LLR values. In a min-sum decoder, the updated message can include the minimum values of the received messages.

Further details of LDPC decoding can be found in U.S. patent application Ser. No. 15/903,604, entitled "MIN-SUM DECODING FOR LDPC CODES," filed Feb. 23, 2018, now U.S. Pat. No. 10,680,647, which is assigned to the assignee hereof and expressly incorporated by reference herein in its entirety.

Figure 2:
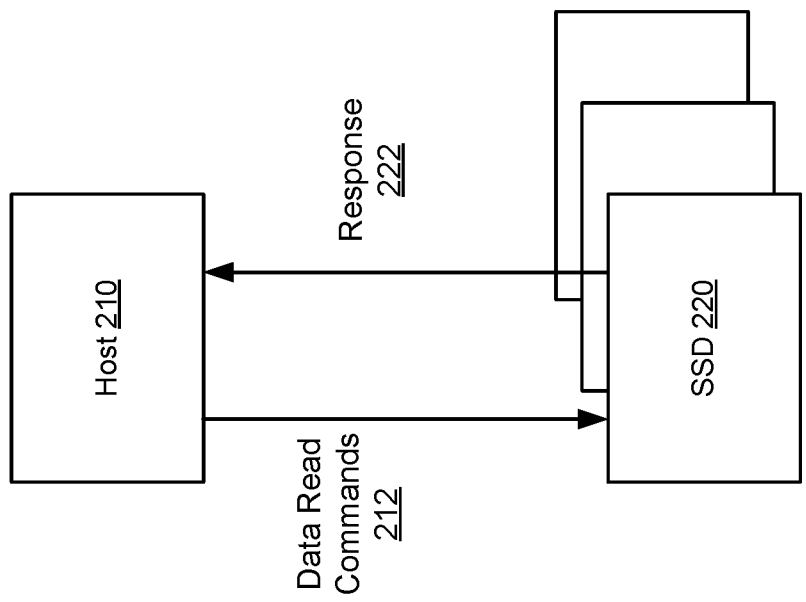
FIG. 2 illustrates an example architecture of a computer system, in accordance with certain embodiments of the present disclosure.

FIG. 2 illustrates an example architecture of a computer system 200 in accordance with certain embodiments of the present disclosure. In an example, the computer system 200 includes a host 210 and one or more solid state disks (SSDs) 220. Each SSD can be a storage system, which can include memory cells and a memory controller coupled to the memory cells for controlling operations of the memory cells. An example of a storage system is described below in connection with FIG. 9. Each memory cell can be an m-bit multi-level cell (MLC), where m is an integer. In some embodiments, as illustrated below in FIGS. 3, 4, and 6, the memory cells are arranged in m pages, each of them bits of a given memory cell providing data for a corresponding one of the m pages.

The host 210 stores data on behalf of clients in the SSDs 220. The data is stored in an SSD as codewords for ECC protection. For instance, the SSD can include an ECC encoder (e.g., the LDPC encoder 110 of FIG. 1).

The host 210 can receive a request of client for the client's data stored in the SSDs 220. In response, the host sends data read commands 212 to the SSDs 220 as applicable. Each of such SSDs 220 processes the received data read command and sends a response 222 to the host 210 upon completion of the processing. The response 222 can include the read data and/or a decoding failure. In an example, each of the SSDs includes an ECC decoder (e.g., the LDPC decoder 140 of FIG. 1). Processing the data read command and sending the response 222 includes decoding by the ECC decoder the codewords stored in the SSD to output the read data and/or the decoding failure. The ECC decoder can include multiple decoders implementing message passing algorithms, such as the min-sum algorithm.

Generally, an SSD can be a storage device that stores data persistently or caches data temporarily in nonvolatile semiconductor memory and is intended for use in storage systems, servers (e.g., within datacenters), and direct-attached storage (DAS) devices. A growing number of applications need high data throughput and low transaction latency and SSDs are used as a viable storage solution to increase the performance, efficiency, reliability and lowering of overall operating expenses. SSDs generally use NAND flash memory and deliver higher performance and consume less power than spinning hard-disk drives (HDDs). NAND Flash memory has a number of inherent issues associated with it, the two most important include a finite life expectancy as NAND Flash cells wear out during repeated writes, and a naturally occurring error rate. SSDs can be designed and manufactured according to a set of industry standards that define particular performance specifications, including latency specifications, to support heavier write workloads, more extreme environmental conditions and recovery from a higher bit error rate (BER) than a client SSD (e.g., personal computers, laptops, and tablet computers).

In the following description, techniques for improving LLR determination in a multi-level memory device are described. These techniques are applicable to any soft decoder that use LLR in decoding.

Figure 3:
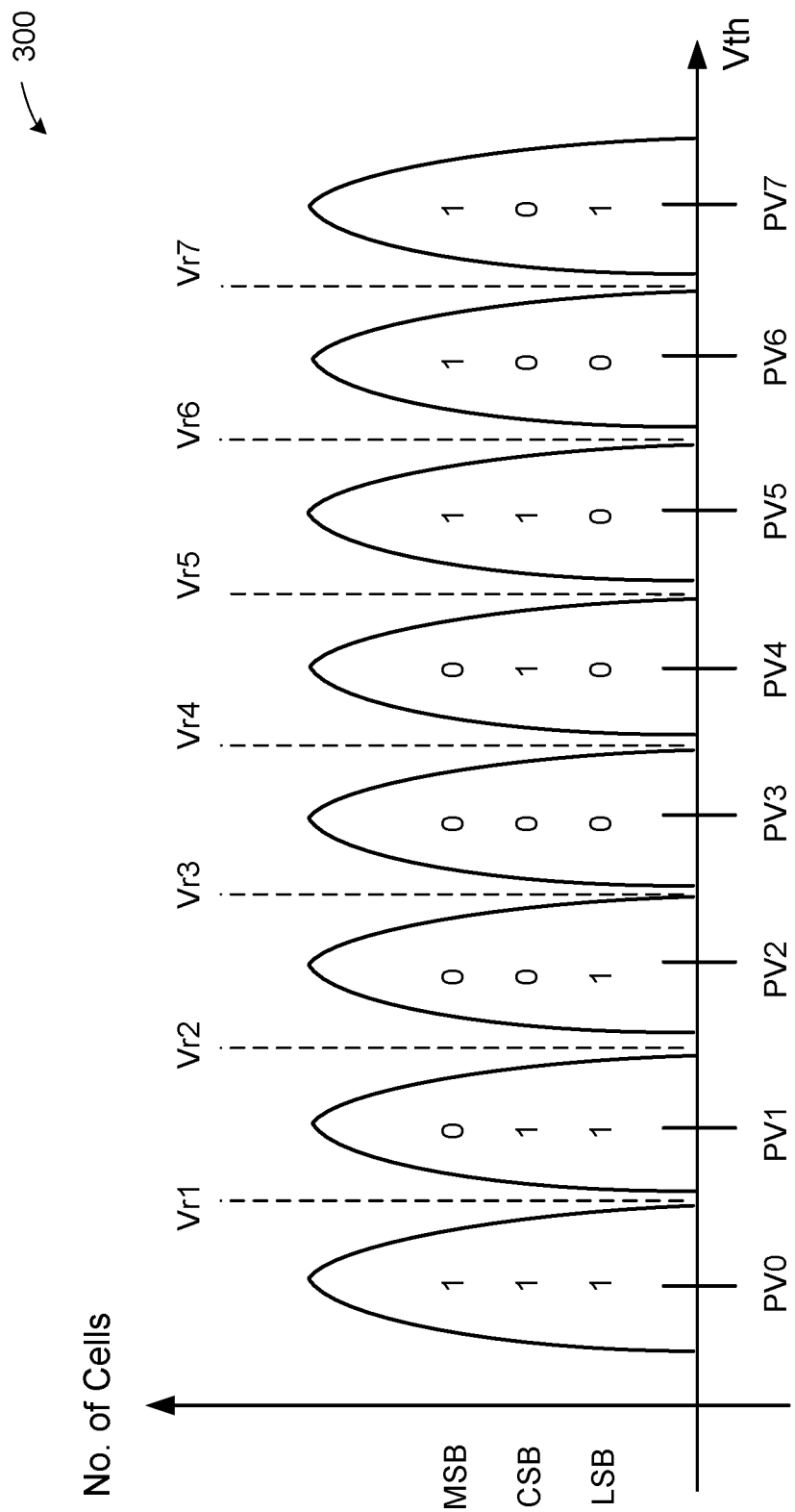
FIG. 3 is a simplified diagram illustrating a distribution of cell voltages of a memory device having a 3-bit tri-level cell (TLC) in a flash memory device according to some embodiments of the present invention.

FIG. 3 is a simplified diagram 300 illustrating a distribution of cell voltages of a memory device having a 3-bit tri-level cell (TLC) in a flash memory device according to some embodiments of the present invention. Flash memory stores multiple bits per cell by modulating the cell into different states or PV-levels using a programming operation. Data can be read from NAND flash memory by applying read reference voltages onto the control gate of each cell, to sense the cell's threshold voltage. For TLC Flash, there are 8 PV-levels and each level corresponds to a unique 3-bit tuple. The first, second and third bits of the cells are grouped together into LSB, CSB and MSB pages respectively as shown in FIG. 3.

In FIG. 3, the target cell programmed voltage (PV) for an erase state is shown as "PV0," and the programmed voltages (PV) for seven programmed states are shown as "PV1" to "PV7." The distribution of cell voltages, or cell threshold voltages, for each of eight data states is represented as a bell-shaped curve associated with each programmed voltage (PV). The spread in cell threshold voltage can be caused by differences in cell characteristics and operation history. In FIG. 3, each cell is configured to store eight data states represented by three bits: a most significant bit (MSB), a center significant bit (CSB), and a least significant bit (LSB). Also shown in FIG. 3 are seven read thresholds, labeled as "Vr1," "Vr2," . . . , and "Vr7," which are used as reference voltages to determine the data stored in the memory cell. For example, two thresholds, Vr1 and Vr5, are used to read the MSB. If the voltage stored by the cell (the programmed voltage or PV) is less than Vr1 or is greater than Vr5, then the MSB is read as a 1. If the voltage is between Vr1 and Vr5, then the MSB is read as a 0. Two thresholds, Vr3 and Vr7, are used to read the LSB. If the voltage stored by the cell is less than Vr3 or is greater than Vr7, then the LSB is read as a 1. If the voltage is between Vr3 and Vr7, then the LSB is read as a 0. Similarly, three thresholds, Vr2, Vr4, and Vr6, are used to read the CSB.

Figure 4:
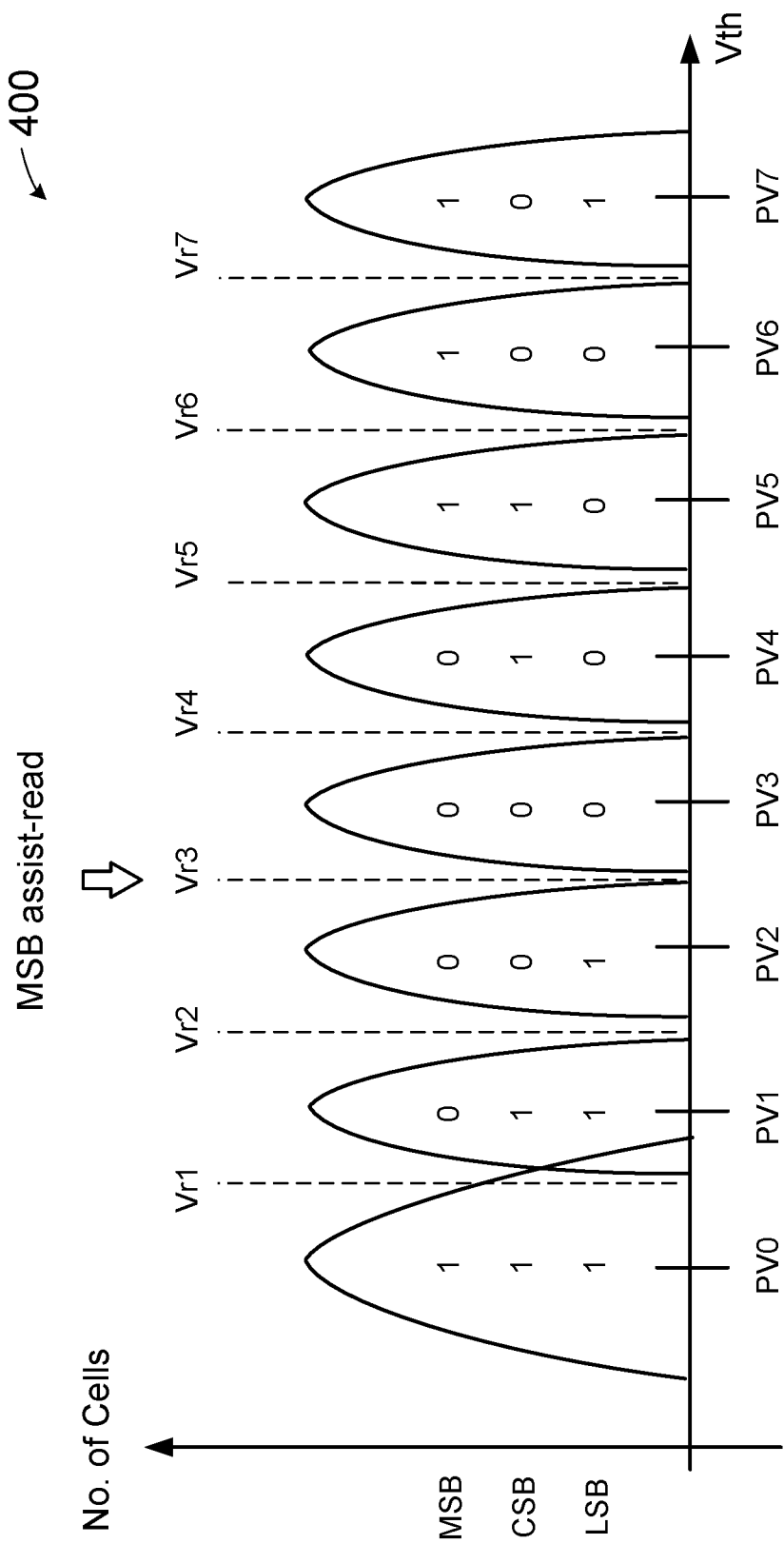
FIG. 4 shows an example of real distribution of TLC cells in different states according to some embodiments of the present invention.

FIG. 3 described above shows ideal distributions and optimal sensing thresholds for a TLC cell. However, in reality, the variances of distributions for different PV levels may not be equal, or the sensing thresholds may not be placed at the optimal voltages. The inventors have observed that the different PV-levels usually have different noise-variances. FIG. 4 shows an example of real distribution of TLC cells 400 in different states according to some embodiments of the present invention. It can be seen that PV0 has higher variance than other states, which can cause the MSB page of the TLC NAND to have a significantly higher bit-error rate when bit-1 is stored (denoted by $p_{1 \to 0}$), compared with the error-rate when bit-0 is stored (denoted by $p_{0 \to 1}$). One reason for the high variance in the erased state (PV0) is that a single erase operation is carried out for a block of memory cells, which can cause large variances in the cell voltage. In contrast, during cell programming, multiple short programming pulses are used to achieve a narrow cell voltage distribution.

Figure 5:
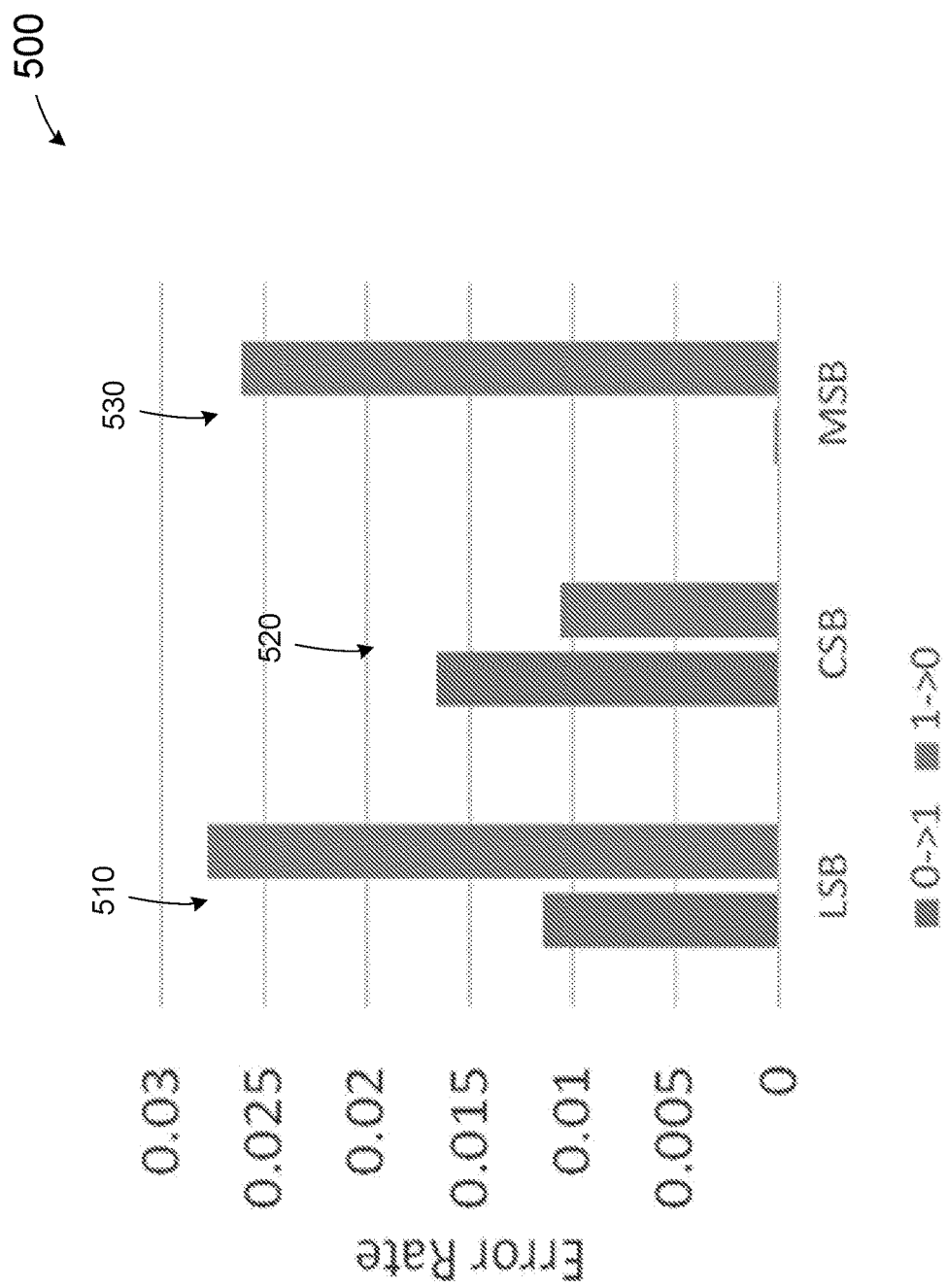
FIG. 5 illustrates an example of bit-error rates for different pages in a TLC Flash memory according to some embodiments of the present invention.

FIG. 5 illustrates an example of bit-error rates 500 for different pages in a TLC Flash memory according to some embodiments of the present invention. In FIG. 5, 510 shows the ratio $p_{1 \to 0}/p_{0 \to 1}$ for the LSB page, 520 shows the ratio $p_{1 \to 0}/p_{0 \to 1}$ for the CSB page, and 530 shows the ratio $p_{1 \to 0}/p_{0 \to 1}$ for the MSB page. It can be seen that the ratio $p_{1 \to 0}/p_{0 \to 1}$ is approximately 3 for the LSB page and 100 for the MSB pages, respectively.

In embodiments of the invention, to better represent the reliability of the bits for the LDPC decoder, different log likelihood ratios (LLR) are generated for the bit 0 and 1 on the MSB pages. To read the MSB of a TLC cell, the read operation needs to distinguish only the states where the MSB page is 1 (erasure state PV0 and PV5, PV6, PV7) from those with an MSB value of 0 (PV1, PV2, PV3 and PV4). Therefore, the read operation needs to determine whether or not the threshold voltage of the cells falls between Vr1 and Vr5 by applying each of these two read reference voltages to determine the MSB bit value.

Hence, the bit 0 and 1 should have different reliability, usually represented by their LLR value calculated by LLR=log(Prob(x=1/0)/(1−Prob(x=1/0))). For example, +4 and −4 may be assigned as the LLR for bit 0 and 1 on CSB and LSB pages since $p_{1 \to 0} \approx p_{0 \to 1}$, as can be seen in FIG. 5. On the other hand, +3 and −5 can be assigned as the LLR for bit 0 and 1 on MSB pages where $p_{1 \to 0} \gg p_{0 \to 1}$. Use of such asymmetric LLR values provides information to the decoder that the received-bits are more reliable than others and improves the decoder correction capability.

The difference in $p_{1 \to 0}$ and $p_{0 \to 1}$ in MSB pages is caused by the higher variance of the first PV-level (Erasure state PV0) compared with other PV-levels. There exist four PV-levels (PV1-PV4) with bit 0 for MSB page. PV1 and PV2 are much more affected by PV0 which causes the asymmetry than PV3 and PV4. In embodiments of the present invention, an assist read operation is added at read threshold voltage Vr3 in addition to Vr1 and Vr5, when reading the MSB page to distinguish whether the cells which have been read as bit-0 on the MSB pages are near PV0 or not. If the cell's threshold voltage is less than Vr3, a lower reliability (absolute LLR value) is assigned to the bit 0; otherwise, a relative higher absolute LLR value is assigned to the bit 0 compared with the case with cell voltage less than R3.

As an example, +4 and −4 can be assigned as the LLR for bit 0 and 1 on CSB and LSB pages. After sensing the cell voltage using Vr1 and Vr5 for the MSB page, one more assist read operation is carried out using threshold Vr3. If the cell voltage is less than Vr3, +2 and −6 can be assigned as the LLR for bit 0 and 1, respectively. If the cell voltage is greater than Vr3, +4 and −4 are assigned as the LLR for bit 0 and 1, respectively. These LLR values inform the decoder that the cells read as bit-1 below Vr3 are most reliable, and the cells read as bit-0 below Vr3 are least reliable, and other cells to be equally reliable.

As another example, given memory cells in an MSB page having symmetric errors, i.e., $p_{1 \to 0} = p_{0 \to 1} = 10\%$.

Let X=Bit written (Unknown to decoder) and Y=Bit read (Known to decoder), and let the following information be based on a channel model, which is a memory-cell threshold-voltage distribution model:

| X | Y | Prob(X, Y) |
|---|---|---|
| 0 | 0 | 90% |
| 0 | 1 | 10% |
| 1 | 0 | 10% |
| 1 | 1 | 90% |

The LLR assignment would be as follows:

| Y | Estimate of X, $\hat{X}$ | Prob (X = $\hat{X}$\|Y) | LLR |
|---|---|---|---|
| 0 | 0 | 90% | +4 |
| 1 | 1 | 90% | −4 |

As another example, given memory cells in an MSB page having asymmetric errors, i.e., $p_{1 \to 0} = 20\%, p_{0 \to 1} = 1\%.$ Let X=Bit written (Unknown to decoder) and Y=Bit read (Known to decoder), and let the following information be based on channel model from normal read operation (using read threshold voltages Vr1 and Vr5):

| X | Y | Prob(Y\|X) |
|---|---|---|
| 0 | 0 | 99% |
| 0 | 1 | 1% |
| 1 | 0 | 20% |
| 1 | 1 | 80% |

The LLR assignment would be as follows:

| Y | Estimate of X, $\hat{X}$ | Probability (X = $\hat{X}$\|Y) | LLR |
|---|---|---|---|
| 0 | 0 | 99/(99 + 20) = 83% | +3 |
| 1 | 1 | 80/(80 + 1) = 99% | −5 |

With an assist-read (e.g., additional read using read threshold value Vr3), the information based on channel model looks like the following:

| X | Y | Assist-Read | Prob(Y\|X, Assist-Read) |
|---|---|---|---|
| 0 | 0 | 0 | 90% |
| 0 | 1 | 0 | 10% |
| 1 | 0 | 0 | 10% |
| 1 | 1 | 0 | 90% |
| 0 | 0 | 1 | 99.9% |
| 0 | 1 | 1 | 0.1% |
| 1 | 0 | 1 | 30% |
| 1 | 1 | 1 | 70% |

The LLR assignment would be as follows:

| Y | Assist-Read | Estimate of X, $\hat{X}$ | Probability (X = $\hat{X}$\|Y, Assist-Read) | LLR |
|---|---|---|---|---|
| 0 | 0 | 0 | 90/(90 + 10) = 90% | +4 |
| 1 | 0 | 1 | 90/(90 + 10) = 90% | −4 |
| 0 | 1 | 0 | 99.9/(99.9 + 30) = 77% | +2 |
| 1 | 1 | 1 | 70/(70 + 0.1) = 99.9% | −6 |

In the description in connection with the TLC in FIGS. 4 and 5, the MSB page was identified as having a high bit error rate. Furthermore, the data in the erased state with programmed voltage PV0 is identified as particularly susceptible. It is also pointed out that LSB could be a potential source of error with a high programmed voltage PV7.

Figure 6:
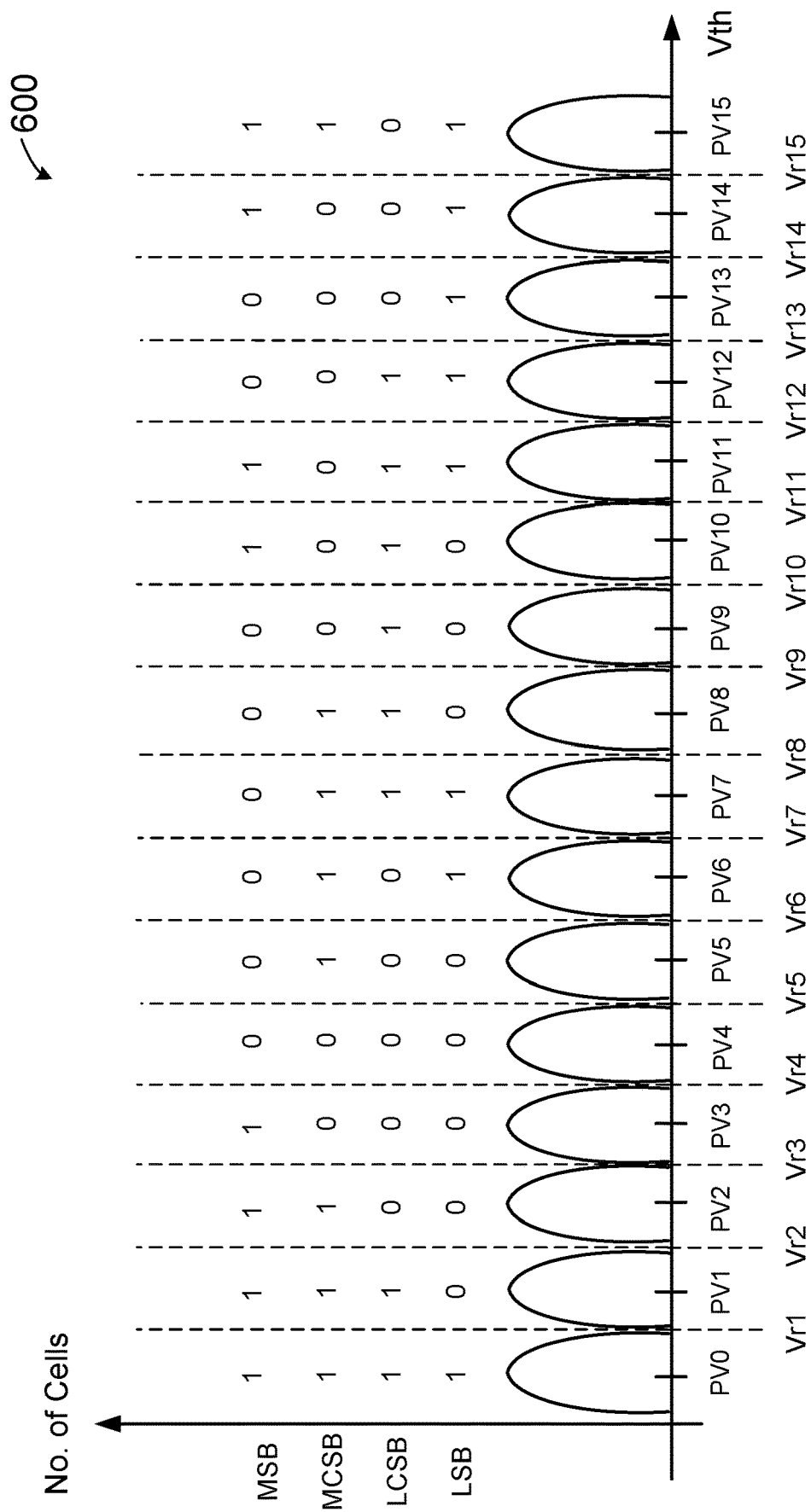
FIG. 6 is a simplified diagram illustrating a distribution of cell voltages of a memory device having a 4-bit quad-level cell (QLC) in a flash memory device according to some embodiments of the present invention.

FIG. 6 is a simplified diagram 600 illustrating a distribution of cell voltages of a memory device having a 4-bit quad-level cell (QLC) in a flash memory device according to some embodiments of the present invention. In quad-level cells (QLC) Flash, there are 16 PV-levels and each level corresponds to a unique 4-bit tuple. In FIG. 6, the target cell programmed voltage (PV) for an erase state is shown as "PV0," and the programmed voltages (PV) for 15 programmed states are shown as "PV1" to "PV15." The first, second, third, and fourth bits of the cells are grouped together into LSB (least significant bit), LCSB (least central significant bit), MCSB (most central significant bit), and MSB (most significant bit) pages, respectively. Also shown in FIG. 6 are 15 read thresholds, labeled as "Vr1," "Vr2," . . . , and "Vr15," which are used as reference voltages to determine the data stored in the memory cell. Similar to the description above in connection with TLC, in QLC, multiple reads using various combinations of read threshold voltages are carried out to determine the 16 PV levels in each cell to determine the four bits stored in the cell.

In the description in connection with the QLC in FIG. 6, the LSB page was identified as potentially having a high bit error rate at the erased state with programmed voltage PV0. Similarly, in the QLC cell in FIG. 6, the programmed state with a high programed voltage PV15 may have a high bit error rate for the MCSB page.

Figure 7:
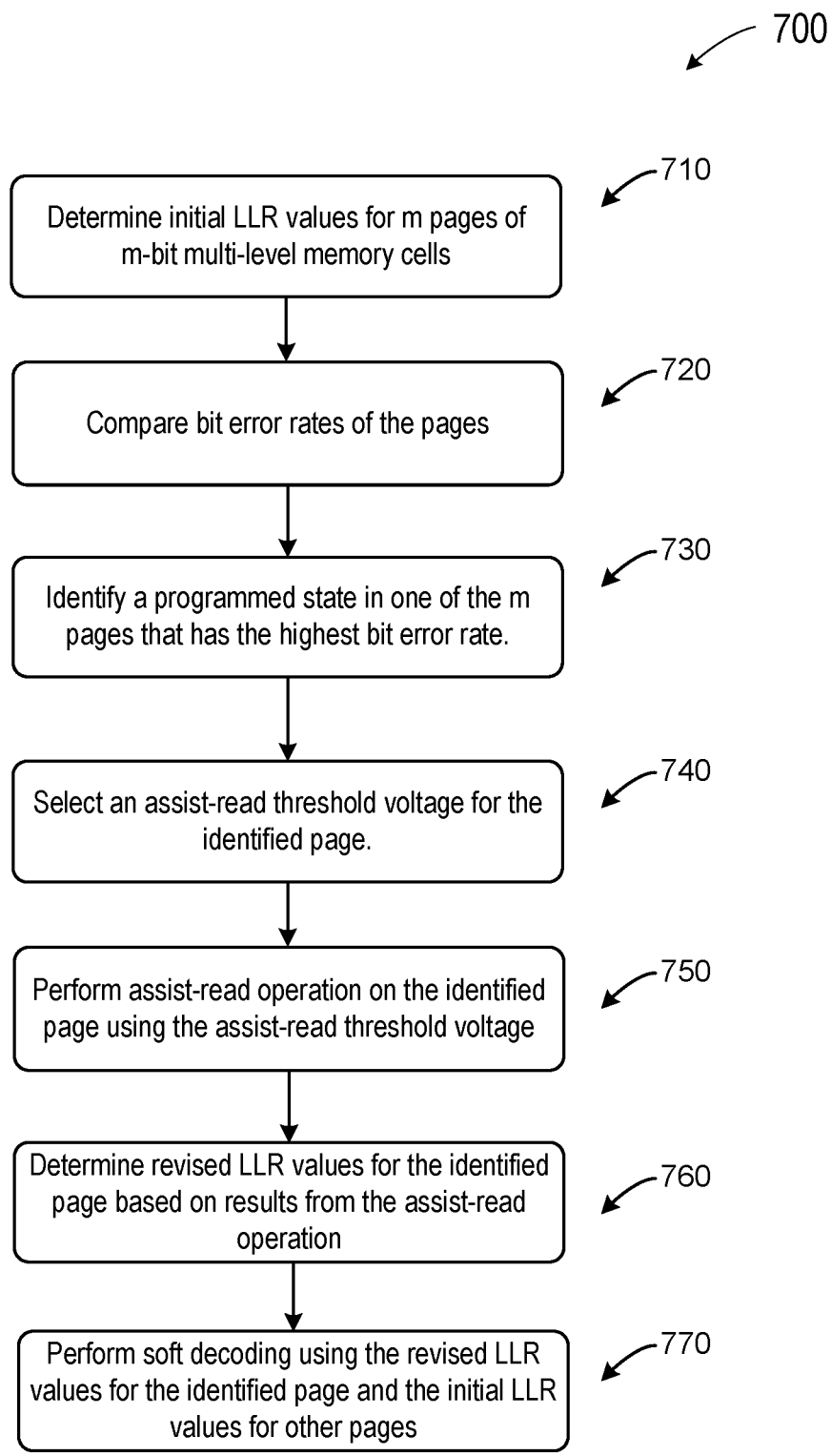
FIG. 7 is a simplified flowchart illustrating a method for operating a storage system according to some embodiments of the present invention.

FIG. 7 is a simplified flowchart illustrating a method of operating a storage system according to some embodiments of the present invention. As shown in FIG. 7, method 700 is directed to operating a storage system, which includes memory cells and a memory controller coupled to the memory cells for controlling operations of the memory cells. Each memory cell is an m-bit multi-level cell (MLC), where m is an integer. The memory cells are arranged in m pages, in which each of the m bits of a given memory cell provides data for a corresponding one of the m pages. For example, the TLC memory cell illustrated in FIG. 3 provides data for a 3-bit multi-level cell (TLC), including one bit each for the MSB, CSB, and LSB, respectively. Similarly, the TLC memory cell illustrated in FIG. 6 provides data for a 4-bit multi-level cell (QLC), including one bit each for the MSB, MCSB, LCSB, and LSB, respectively. The method includes using an assist-read to improve the LLR determination, as described below.

At 710, the initial LLR (log likelihood ratio) values for each of the m pages are determined. Depending on the system and application, various conventional methods can be used to determine the LLR values. For example, fine-grained memory-cell sensing can be used for calculation of LLR values. Alternatively, calculation of LLR can be based on the availability of a memory-cell threshold-voltage distribution model, which is also referred to as a channel model. In the numerical examples described above, the channel model approach was used.

At 720, bit error rates in the m pages are compared, and, at 730, the method includes identifying a programmed state in one of the m pages that has high variance in programmed voltage levels (PV) or a high bit error rate, as illustrated in FIGS. 4 and 5. In some embodiments, the programmed state that has a high bit error rate can be an erased state having an adjacent opposite programmed state. In this case, the assist-read threshold voltage can be selected to distinguish an adjacent opposite programmed state from the erased state. Alternatively, the programmed state that has a high bit error rate comprises a highest programmed state having an adjacent opposite programmed state. In this case, the assist-read threshold voltage is selected to distinguish the adjacent opposite programmed state from the highest programmed state.

For example, in the description in connection with the TLC in FIGS. 4 and 5, the MSB page was identified as having a high bit error rate. Furthermore, the data in the erased state with programmed voltage PV0 is identified as particularly susceptible. It is also pointed out that LSB could be a potential source of error with a high programmed voltage PV7. In the description in connection with the QLC in FIG. 6, the LSB page was identified as potentially having a high bit error rate at the erased state with programmed voltage PV0. Similarly, in the QLC cell in FIG. 6, the programmed state with a high programed voltage PV15 may have a high bit error rate for the MC SB page.

At 740, the method selects an assist-read threshold voltage for the identified page. In some embodiments, the assist-read threshold voltage can be a read threshold voltage adjacent to or close to the read threshold voltage for the programmed state identified as being susceptible. For example, in the description in connection with the TLC in FIGS. 4 and 5, the MSB page was identified as having a high bit error rate at the programmed state with programmed voltage PV0, which is read with a read threshold voltage Vr1. In this case, an assist-read threshold voltage can be selected as Vr2 or Vr3. Similarly, the assist-read threshold voltage can be Vr6 or Vr5 for a high programmed state PV7 in LSB of TLC in FIG. 4 with read threshold voltage Vr7. In the example of the QLC in FIG. 6, the programed state PV0 in the LSB page is read with a read threshold voltage Vr1, and the assist-read threshold voltage can be Vr2 or Vr3. Similarly, in the QLC cell in FIG. 6, the programmed state with a high programed voltage PV15 in the MCSB page is read with a read threshold voltage of Vr15, and the assist-read threshold voltage can be Vr14 or Vr13.

At 750, the method performs an assist-read operation on the identified page using the assist-read threshold voltage. At 760, the method includes determining revised LLR values for the identified page based on results from the assist-read operation. The revised LLR values can be determined, for example, using a memory-cell threshold-voltage distribution model, which is also referred to as a channel model. In this case, the assist-read operation provides additional data to the model for calculating the LLR.

At 770, the method performs soft decoding using the revised LLR values for the identified page and the initial LLR values for other pages. In the TLC example described above, the revised LLR values for the MSB page and the initial LLR values for the CSB and LSB pages are used in the soft decoding.

Figure 8:
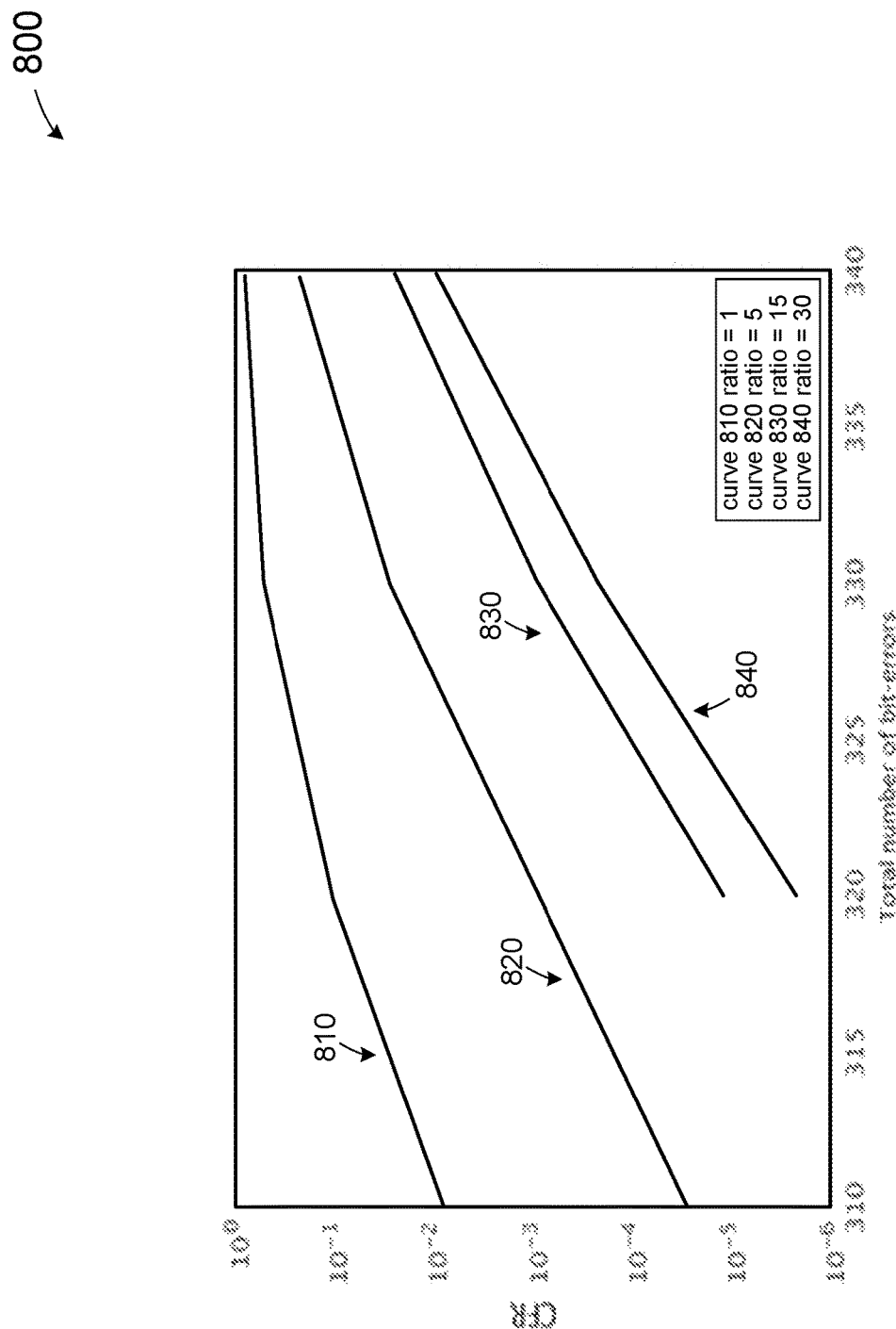
FIG. 8 is a plot of simulated performance data illustrating the benefits of the asymmetric LLR determination according to various embodiments of the present invention.

FIG. 8 is a plot of simulated performance data illustrating the benefits of the asymmetric LLR determination according to some embodiments of the present invention. FIG. 8 a plot showing the codeword failure rate (CFR) versus the total number of bit-errors in the input to the decoder. Curve 810 shows CFR vs. total number of bit-errors for an example of symmetric LLRs, where the ratio $p_{1 \to 0}/p_{0 \to 1}=1$. Curves 820, 830, and 840 are examples of asymmetric LLRs, with the ratio $p_{1 \to 0}/p_{0 \to 1}$ being 5, 15, and 30, respectively. When the asymmetric LLR values are used to initialize a LDPC decoder which can utilize soft-information (for e.g. min-sum decoder or sum-product decoder), the correction performance of the decoder, as measured by the codeword failure rate (CFR), improves significantly.

Figure 9:
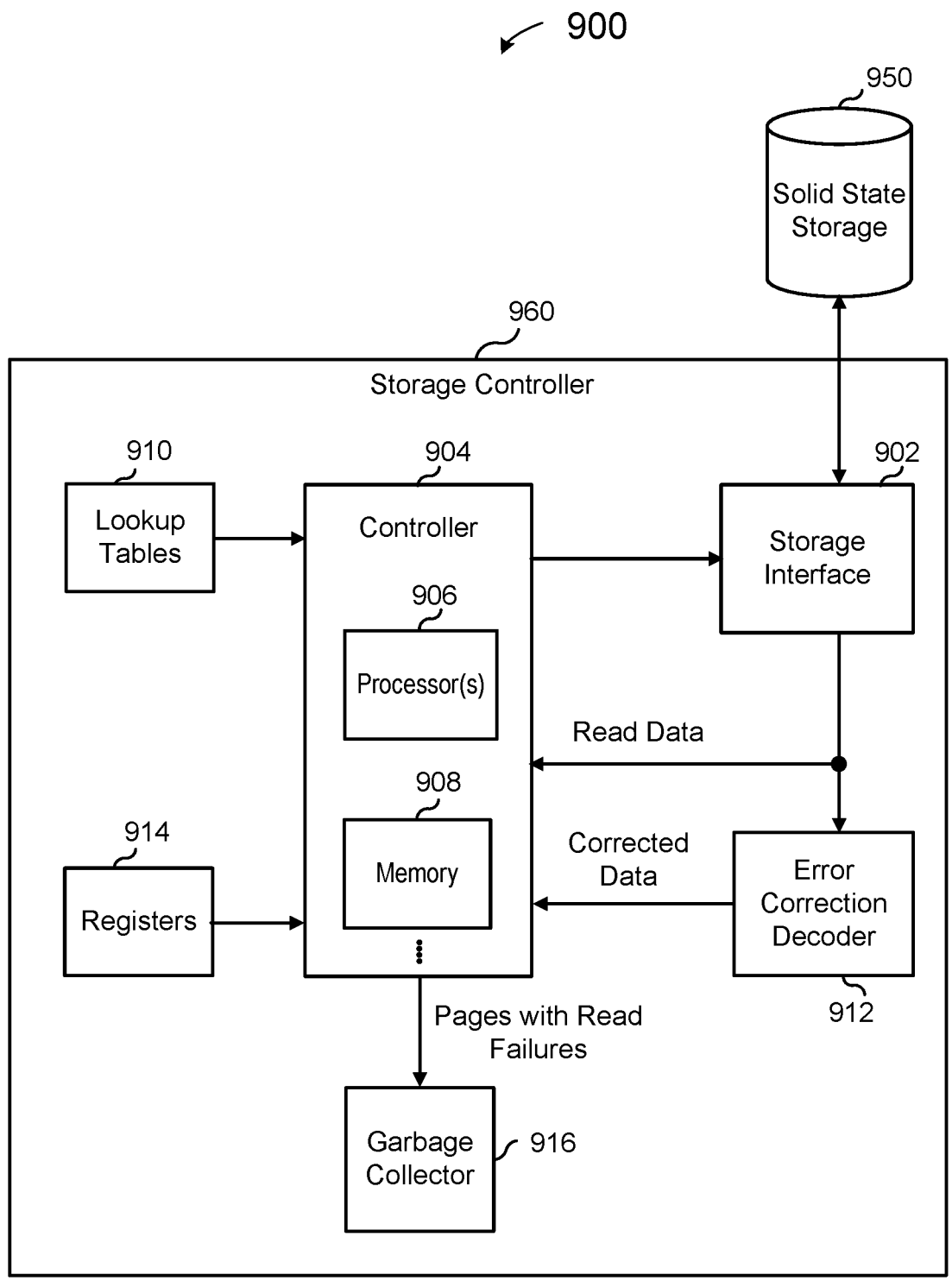
FIG. 9 is a simplified block diagram illustrating a solid state storage system in accordance with certain embodiments of the present disclosure.

FIG. 9 is a simplified block diagram illustrating a solid state storage system in accordance with certain embodiments of the present disclosure. As shown, solid state storage system 900 can include a solid state storage device 950 and a storage controller 960. Storage controller 960, also referred to as a memory controller, is one example of a system which performs the techniques described herein. In some embodiments, storage controller 960 can be implemented on a semiconductor device, such as an ASIC or FPGA. Some of the functions can also be implemented in firmware.

Controller 904 can include one or more processors 906 and memories 908 for performing the control functions described above. Storage controller 960 can also include lookup tables 910, which can include a table for degraded blocks and a table for bad blocks, etc. Registers 914 can be used to store data for control functions, such as threshold values for degraded block counts, etc.

Controller 904 can be coupled to solid state storage 950 through a storage interface 902. Error correction decoder 912 (e.g., an LDPC decoder or a BCH decoder) can perform error correction decoding on the read data and sends the corrected data to controller 904. Controller 904 can identify the pages with read failures to garbage collector 916, which performs corrective processing on those pages (e.g., by copying the data, with or without error correction decoding, to a new location).

Figure 10:
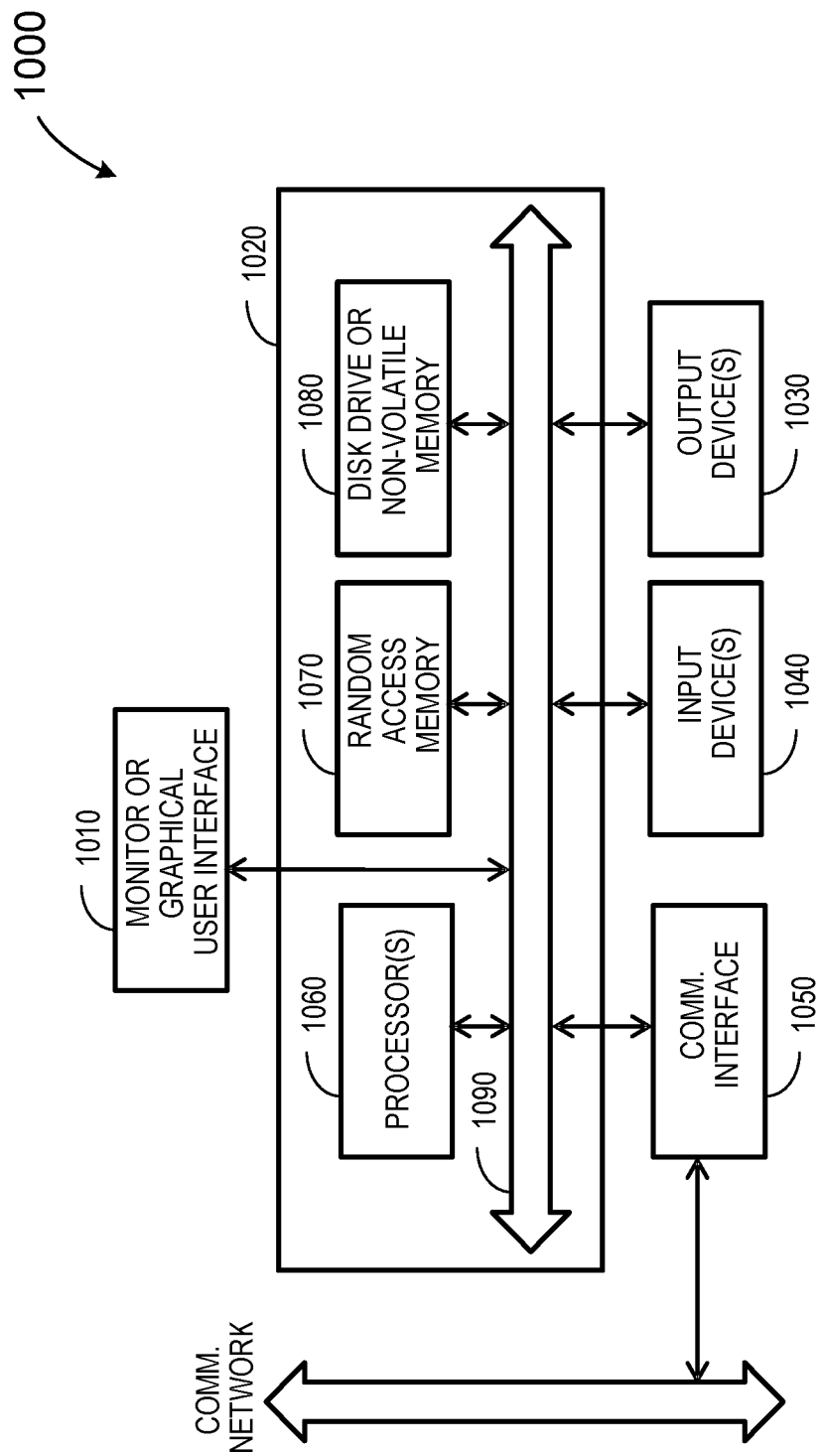
FIG. 10 is a simplified block diagram illustrating an apparatus that may be used to implement various embodiments according the present disclosure.

FIG. 10 is a simplified block diagram illustrating an apparatus that may be used to implement various embodiments according the present disclosure. FIG. 10 is merely illustrative of an embodiment incorporating the present disclosure and does not limit the scope of the invention as recited in the claims. One of ordinary skill in the art would recognize other variations, modifications, and alternatives. In one embodiment, computer system 1000 typically includes a monitor 1010, a computer 1020, user output devices 1030, user input devices 1040, communications interface 1050, and the like.

As shown in FIG. 10, computer 1020 may include a processor(s) 1060 that communicates with a number of peripheral devices via a bus subsystem 1090. These peripheral devices may include user output devices 1030, user input devices 1040, communications interface 1050, and a storage subsystem, such as random access memory (RAM) 1070 and disk drive 1080. As an example, a disk drive can include solid state disk (SSD) implemented with non-volatile memory devices such as SSD 220 depicted in FIG. 2 or storage device 900 depicted in FIG. 9 with features described above.

User input devices 1040 include all possible types of devices and mechanisms for inputting information to computer system 1020. These may include a keyboard, a keypad, a touch screen incorporated into the display, audio input devices such as voice recognition systems, microphones, and other types of input devices. In various embodiments, user input devices 1040 are typically embodied as a computer mouse, a trackball, a track pad, a joystick, a wireless remote, a drawing tablet, a voice command system, an eye tracking system, and the like. User input devices 1040 typically allow a user to select objects, icons, text and the like that appear on the monitor 1010 via a command such as a click of a button or the like.

User output devices 1030 include all possible types of devices and mechanisms for outputting information from computer 1020. These may include a display (e.g., monitor 1010), non-visual displays such as audio output devices, etc.

Communications interface 1050 provides an interface to other communication networks and devices. Communications interface 1050 may serve as an interface for receiving data from and transmitting data to other systems. Embodiments of communications interface 1050 typically include an Ethernet card, a modem (telephone, satellite, cable, ISDN), (asynchronous) digital subscriber line (DSL) unit, FireWire interface, USB interface, and the like. For example, communications interface 1050 may be coupled to a computer network, to a FireWire bus, or the like. In other embodiments, communications interfaces 1050 may be physically integrated on the motherboard of computer 1020, and may be a software program, such as soft DSL, or the like.

In various embodiments, computer system 1000 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 1020 includes one or more Xeon microprocessors from Intel as processor(s) 1060. Further, in one embodiment, computer 1020 includes a UNIX-based operating system.

RAM 1070 and disk drive 1080 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1070 and disk drive 1080 may be configured to store the basic programming and data constructs that provide the functionality of the present invention.

Software code modules and instructions that provide the functionality of the present invention may be stored in RAM 1070 and disk drive 1080. These software modules may be executed by processor(s) 1060. RAM 1070 and disk drive 1080 may also provide a repository for storing data used in accordance with the present invention.

RAM 1070 and disk drive 1080 may include a number of memories including a main random access memory (RAM) for storage of instructions and data during program execution and a read only memory (ROM) in which fixed non-transitory instructions are stored. RAM 1070 and disk drive 1080 may include a file storage subsystem providing persistent (non-volatile) storage for program and data files. RAM 1070 and disk drive 1080 may also include removable storage systems, such as removable flash memory.

Bus subsystem 1090 provides a mechanism for letting the various components and subsystems of computer 1020 communicate with each other as intended. Although bus subsystem 1090 is shown schematically as a single bus, alternative embodiments of the bus subsystem may utilize multiple busses. Bus system 1090 may be a PCI Express bus that may be implemented using PCIe PHY embodiments of the present disclosure.

FIG. 10 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that the invention's usefulness is not limited thereto and that the embodiments of the present invention can be beneficially implemented in any number of environments for any number of purposes.

What is claimed is:

1. A method of operating a storage system, the storage system including memory cells and a memory controller coupled to the memory cells for controlling operations of the memory cells, wherein each memory cell is a 3-bit tri-level cell (TLC), wherein the memory cells are arranged in LSB (least significant bit) pages, CSB (center significant bit) pages, and, MSB (most significant bit) pages, wherein each of the memory cells comprises eight programmed voltage (PV) levels (PV0-PV7), wherein PV0 is an erased state, the method comprising:
performing a read operation on the memory cells in response to a read command from a host, wherein performing the read operation comprises reading the memory cells using seven read threshold values (Vr1-Vr7) to determine the programmed voltages of the memory cells, including using the read threshold values Vr1 and Vr5 for MSB, using the read threshold values Vr2, Vr4, and Vr6 for CSB, and using the read threshold values Vr3 and Vr7 for LSB;

determining initial LLR (log likelihood ratio) values for the memory cells based on a result from the read operation;

performing an assist-read operation on the memory cells in the MSB page, by reading the memory cells using the read threshold value Vr2 or Vr3, which are positioned between the programmed voltage levels PV3 and PV4;

determining revised LLR values for the MSB page based on results from the assist-read operation; and performing soft decoding using the revised LLR values for the MSB page and the initial LLR values for the CSB page and the LSB page.

2. The method of claim 1, wherein determining initial LLR (log likelihood ratio) values comprises using a memory-cell threshold-voltage distribution model to determine the initial LLR values.

3. The method of claim 1, wherein determining initial LLR values comprises using fine-grained memory-cell sensing for calculation of LLR values.

4. The method of claim 1, wherein determining revised LLR (log likelihood ratio) values comprises using a memory-cell threshold-voltage distribution model to determine the revised LLR values.

5. A method of operating a storage system, the storage system including memory cells and a memory controller coupled to the memory cells for controlling operations of the memory cells, wherein each memory cell is an m-bit multi-level cell (MLC), where m is an integer, the memory cells arranged in m pages, each of the m bits of a given memory cell providing data for a corresponding one of the m pages, the method comprising:

determining initial LLR (log likelihood ratio) values for each of the m pages;

comparing bit error rates in the m pages;

identifying a programmed state in one of the m pages that has a high bit error rate (BER);

selecting an assist-read threshold voltage of the identified page;

performing an assist-read operation on the identified page using the assist-read threshold voltage;

determining revised LLR values for the identified page based on results from the assist-read operation; and performing soft decoding using the revised LLR values for the identified page and the initial LLR values for other pages.

6. The method of claim 5, wherein the programmed state that has a high bit error rate comprises an erased state having an adjacent opposite programmed state, wherein the assist-read threshold voltage is selected to distinguish the adjacent opposite programmed state from the erased state.

7. The method of claim 5, wherein the programmed state that has a high bit error rate comprises a highest programmed state having an adjacent opposite programmed state, wherein the assist-read threshold voltage is selected to distinguish the adjacent opposite programmed state from the highest programmed state.

8. The method of claim 5, wherein determining initial LLR (log likelihood ratio) values comprises using a memory-cell threshold-voltage distribution model to determine the initial LLR values.

9. The method of claim 5, wherein determining initial LLR values comprises using fine-grained memory-cell sensing for calculation of LLR values.

10. The method of claim 5, wherein each memory cell is a 3-bit tri-level cell (TLC), and the memory cells are arranged in LSB (least significant bit) pages, CSB (center significant bit) pages, and MSB (most significant bit) pages, using seven read threshold voltages (Vr1-Vr7), wherein the assist-read is performed on the MSB page using an assist-read threshold voltage Vr2 or Vr3.

11. The method of claim 5, wherein each memory cell is a 3-bit tri-level cell (TLC), and the memory cells are arranged in LSB (least significant bit) pages, CSB (center significant bit) pages, and MSB (most significant bit) pages, using seven read threshold voltages (Vr1-Vr7), wherein the assist-read is performed on the LSB pages using an assist-read threshold voltage Vr5 or Vr6.

12. The method of claim 5, wherein each memory cell is a 4-bit quad-level cell (QLC), and the memory cells are arranged in LSB (least significant bit) pages, LCSB (least central significant bit) pages, MCSB (most central significant bit) pages, and MSB (most significant bit) pages, using fifteen read threshold voltages (Vr1-Vr15), wherein the assist-read is performed on the LSB pages using an assist-read threshold voltage Vr2 or Vr3.

13. The method of claim 5, wherein each memory cell is a 4-bit quad-level cell (QLC), and the memory cells are arranged in LSB (least significant bit) pages, LCSB (least central significant bit) pages, MCSB (most central significant bit) pages, and MSB (most significant bit) pages, using fifteen read threshold voltages (Vr1-Vr15), wherein the assist-read is performed on the MCSB pages using an assist-read threshold voltage Vr13 or Vr14.

14. A storage system, the storage system including memory cells and a memory controller coupled to the memory cells for controlling operations of the memory cells, wherein each memory cell is an m-bit multi-level cell (MLC), where m is an integer, the memory cells arranged in m pages, each of the m bits of a given memory cell providing data for a corresponding one of the m pages, wherein the memory controller is configured to:

determine initial LLR (log likelihood ratio) values for each of the m pages;

compare bit error rates in the m pages;

identify a programmed state in one of the m pages that has a high bit error rate;

select an assist-read threshold voltage of the identified page;

perform an assist-read operation on the identified page using the assist-read threshold voltage;

determine revised LLR values for the identified page based on results from the assist-read operation; and perform soft decoding using the revised LLR values for the identified page and the initial LLR values for other pages.

15. The storage system of claim 14, wherein the programmed state that has a high bit error rate comprises an erased state having an adjacent opposite programmed state, wherein the assist-read threshold voltage is selected to distinguish the adjacent opposite programmed state from the erased state.

16. The storage system of claim 14, wherein the programmed state that has a high bit error rate comprises a highest programmed state having an adjacent opposite programmed state, wherein the assist-read threshold voltage is selected to distinguish the adjacent opposite programmed state from the highest programmed state.

17. The storage system of claim 14, wherein the memory controller is configured to determine initial LLR (log likelihood ratio) values using a memory-cell threshold-voltage distribution model to determine the initial LLR values.

18. The storage system of claim 14, wherein the memory controller is configured to determine initial LLR values using fine-grained memory-cell sensing for calculation of LLR values.

19. The storage system of claim 14, wherein each memory cell is a 3-bit tri-level cell (TLC), and the memory cells are arranged in LSB (least significant bit) pages, CSB (center significant bit) pages, and MSB (most significant bit) pages, using seven read threshold voltages (Vr1-Vr7), wherein the memory controller is configured to perform the assist-read on the MSB page using an assist-read threshold voltage Vr2 or Vr3.

20. The storage system of claim 14, wherein each memory cell is a 3-bit tri-level cell (TLC), and the memory cells are arranged in LSB (least significant bit) pages, CSB (center significant bit) pages, and MSB (most significant bit) pages, using seven read threshold voltages (Vr1-Vr7), wherein the memory controller is configured to perform the assist-read on the LSB page using an assist-read threshold voltage Vr5 or Vr6.

* * * * *